(12) United States Patent
Kwon et al.

(10) Patent No.: US 10,553,808 B2
(45) Date of Patent: Feb. 4, 2020

(54) ORGANIC LIGHT-EMITTING ELEMENT AND DISPLAY DEVICE HAVING THE SAME

(71) Applicant: LG Display Co., Ltd., Yeongdeungpo-gu (KR)

(72) Inventors: Sun Kap Kwon, Paju-si (KR); Kwan Soo Kim, Paju-si (KR); Kyu Il Han, Paju-si (KR); Kwang Hyun Kim, Daegu (KR); Mi Na Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/673,325

(22) Filed: Aug. 9, 2017

(65) Prior Publication Data
US 2018/0062104 A1    Mar. 1, 2018

(30) Foreign Application Priority Data
Aug. 31, 2016    (KR) .......................... 10-2016-0112251

(51) Int. Cl.
*H01L 51/50*    (2006.01)
*H01L 51/52*    (2006.01)

(52) U.S. Cl.
CPC ...... *H01L 51/5092* (2013.01); *H01L 51/5228* (2013.01); *H01L 51/5231* (2013.01); *H01L 51/504* (2013.01); *H01L 51/5265* (2013.01); *H01L 2251/558* (2013.01)

(58) Field of Classification Search
CPC ............. H01L 51/5092; H01L 51/5228; H01L 51/504; H01L 51/5221
See application file for complete search history.

(56) References Cited

U.S. PATENT DOCUMENTS

| 2014/0332790 | A1* | 11/2014 | Fadhel | H01L 51/0072 |
| | | | | 257/40 |
| 2015/0243934 | A1* | 8/2015 | Han | H01L 51/56 |
| | | | | 438/34 |
| 2016/0079316 | A1* | 3/2016 | Zhou | H01L 51/5278 |
| | | | | 257/13 |
| 2016/0211460 | A1* | 7/2016 | Yoon | H01L 51/0061 |

FOREIGN PATENT DOCUMENTS

| CN | 102668156 A | 9/2012 |
| WO | 2014/088667 A2 | 6/2014 |

OTHER PUBLICATIONS

Chinese Office Action dated Jan. 25, 2019, for Chinese Application No. 201710630709.3, 17 pages. (With English Translation).

* cited by examiner

*Primary Examiner* — Phat X Cao
(74) *Attorney, Agent, or Firm* — Seed Intellectual Property Law Group LLP

(57) ABSTRACT

An organic light-emitting display device has improved transmittance and UV light reliability by optimizing the thickness and material of a cathode. An organic light-emitting display device comprises an organic light-emitting element on a substrate, the organic light-emitting element including an anode, an organic light emitting layer, and a cathode, an organic layer between the substrate and the organic light-emitting element, and an auxiliary layer adjacent to the cathode and including a material having electron injection ability, such that the influence of UV lights on the OLED device is reduced, thereby improving the efficiency and lifespan of the organic light-emitting element.

16 Claims, 11 Drawing Sheets

ORGANIC LIGHT-EMITTING ELEMENT AND DISPLAY DEVICE HAVING THE SAME

CROSS-REFERENCE TO RELATED APPLICATIONS

This application claims the priority from Korean Patent Application No. 10-2016-0112251 filed on Aug. 31, 2016, in the Korean Intellectual Property Office, the disclosure of which is incorporated herein by reference in its entirety.

BACKGROUND

Technical Field

The present disclosure relates to an organic light-emitting element with improved transmittance and UV light reliability, and an organic light-emitting display (OLED) device having the same.

Description of the Related Art

An OLED device includes an organic light-emitting element including an organic light emitting layer, an anode and a cathode, a driving element for driving the organic light-emitting element such as a transistor, a capacitor, etc. In detail, the OLED device utilizes the phenomenon that holes injected from an anode and electrons injected from a cathode recombine in an emission layer to form excitons, and light of a particular wavelength is generated by energy released when the excitons relax from an excited state to the ground state. Accordingly, the OLED device has advantages in that it has fast response speed, high contrast ratio, good luminous efficiency, high brightness and large viewing angle.

In detail, in the organic light-emitting element, an anode is formed by using a reflective layer formed of a transparent conductive material such as indium tin oxide (ITO) or a metal film such as aluminum (Al) on a substrate, and a hole injection layer (HIL), a hole transport layer (HTL), and an emitting layer are formed on the anode. A dopant may be added to the emitting layer as desired. Then, an electron transport layer (ETL), an electron injection layer (EIL) and a cathode may be formed on the emitting layer. The electron injection layer may be deposited using lithium fluoride (LiF), lithium oxide ($Li_2O$), alkali metal and alkaline earth metal. The cathode may be formed of a transparent conductive material such as indium tin oxide or a metal film such as aluminum (Al).

BRIEF SUMMARY

In a top-emission OLED device, light exists via the cathode, and thus the cathode is formed to be translucent or transparent. When a metal film such as aluminum (Al) is used for the cathode, the metal film is required to be thin to improve the transmittance of the cathode. And, the reflectivity of the cathode is reduced, such that the efficiency of the organic light-emitting element may be lowered. In detail, the efficiency of the organic light-emitting element can be increased by generating a micro-cavity resonance effect in the organic light-emitting element. If the reflectivity of the cathode is lowered, it may reduce the micro-cavity resonance effect.

Display devices using such an organic light-emitting element may find applications in a mobile phone, a smart watch, a tablet PC, a monitor, a laptop computer, a TV, a public display, an automotive display, etc. In addition, such an organic light-emitting element may be applied to a wearable display device, a foldable display device, and a rollable display device as well.

Among them, the mobile phones, the smart watch, the tablet PC and the public display are frequently exposed to external light including UV light, and thus require light stability to UV light. In detail, if the OLED device is exposed to UV light for a long time, cations or anions are generated in an inorganic layer or an organic layer formed on or under the organic light-emitting element. Such cations or anions formed in the inorganic layer or the organic layer move to the organic light-emitting element to combine with a hole injecting material, such that the efficiency of the organic light-emitting element is lowered, and the material of the cathode is easily aggregated, to shrink the pixel.

In view of the above, what is required is a cathode capable of increasing the efficiency of the organic light-emitting element by ensuring the light stability to UV light.

The inventors of the disclosure have devised an OLED device capable of improving the efficiency of an organic light-emitting element by way of modifying and improving the thickness and the material of a cathode of the organic light-emitting element to form an auxiliary layer.

An aspect of the present disclosure is to provide an OLED device in which an auxiliary layer is formed on or under a cathode to avoid electron injection characteristic of an organic light-emitting element from deteriorating by UV light, to thereby reduce the influence on the organic light-emitting element by UV light so as to improve the efficiency and the lifespan.

Another aspect of the present disclosure is to provide an OLED device in which an auxiliary layer is formed on or under a cathode to reduce aggregation of silver (Ag) particles included in the cathode by UV light which may cause a pixel to shrink.

In addition, another aspect of the present disclosure is to provide an OLED device in which the thickness of a cathode is modified and improved such that the influence on the organic light-emitting element by UV light is reduced, thereby improving the efficiency and the lifespan.

In addition, an aspect of the present disclosure is to provide an OLED device in which the thickness of a cathode is optimized to reduce micro-cavity resonance effect, such that chromaticity difference according to viewing angles is decreased, thereby reducing color change according to viewing angles.

It should be noted that objects of the present disclosure are not limited to the above-described objects, and other objects of the present disclosure will be apparent to those skilled in the art from the following descriptions.

According to an embodiment of the present disclosure, an organic light-emitting display device comprises an organic light-emitting element on a substrate, the organic light-emitting element including an anode, an organic light emitting layer, and a cathode, an organic layer between the substrate and the organic light-emitting element, and an auxiliary layer adjacent to the cathode. The auxiliary layer includes a material having electron injection characteristic, such that the influence on the OLED device by UV light is suppressed, thereby improving the efficiency and lifespan of the organic light-emitting element.

According to an embodiment of the present disclosure, an organic light-emitting display device comprises an organic light-emitting element including a cathode having silver (Ag), an anode and an organic light emitting layer, an inorganic layer on the organic light-emitting element, and an auxiliary layer adjacent to the cathode. The auxiliary layer having a material that reduces aggregation of the silver (Ag), such that it is possible to prevent the shrinkage of the emission area of a sub-pixel due to the aggregation of the silver (Ag).

According to an embodiment of the present disclosure, an organic light-emitting display device comprises an organic layer on a flexible substrate, an anode on the organic layer, a light emitting layer disposed on the anode, and a cathode on the light emitting layer, the cathode having silver (Ag) and including a thickness of 120 Å to 250 Å, such that the efficiency and lifespan of the organic light-emitting element can be improved.

Particulars of the embodiments of the present disclosure will be described in the detail description with reference to the accompanying drawings.

According to embodiments of the present disclosure, an auxiliary layer including a material that easily combines with anions generated in an organic layer by UV light is disposed adjacent to a cathode, such that influence on an organic light-emitting element by UV light can be reduced, to thereby improve the efficiency and lifespan of the organic light-emitting element.

In addition, according to embodiments of the present disclosure, an auxiliary layer is formed by co-deposition of a metal having a work function of 2.93 eV or less and a material having electron injection characteristic, such that it is possible to reduce in the efficiency drop of the organic light-emitting element by UV light, to thereby improve lifespan of the organic light-emitting element.

In addition, according to embodiments of the present disclosure, an auxiliary layer including a material that easily combines with hydrogen ions generated in an inorganic layer by UV light is disposed adjacent to a cathode, such that influence on an organic light-emitting element by UV light can be reduced, to thereby improve the efficiency and lifespan of the organic light-emitting element.

In addition, according to embodiments of the present disclosure, by disposing an auxiliary layer adjacent to the cathode including silver (Ag), it is possible to reduce silver (Ag) particles aggregate by UV light such that a pixel shrink can be prevented.

In addition, according to embodiments of the present disclosure, the light resistance against UV light can be ensured and the efficiency and lifetime of the organic light-emitting element can be improved by forming the cathode with a thickness of 120 Å to 250 Å.

In addition, according to embodiments of the present disclosure, the first cathode is formed to have a thickness from 20 Å to 50 Å and the second cathode is formed to have a thickness from 100 Å to 200 Å, thereby ensuring light resistance against UV light. Accordingly, the efficiency and lifespan of the organic light-emitting element can be improved, and a chromaticity difference over viewing angles can be reduced.

In addition, according to embodiments of the present disclosure, the first cathode includes Yb to reduce the increasing of driving voltage of the organic light-emitting element due to UV light and to improve the lifetime of the organic light-emitting element.

In addition, according to embodiments of the present disclosure, the proportion of silver (Ag) may be higher than the alkali metal or alkaline earth metal in the second cathode, such that the efficiency of the organic light-emitting element can be improved.

The Summary is not to specify essential features of the appended claims, and thus the scope of the claims is not limited thereby.

BRIEF DESCRIPTION OF THE SEVERAL VIEWS OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
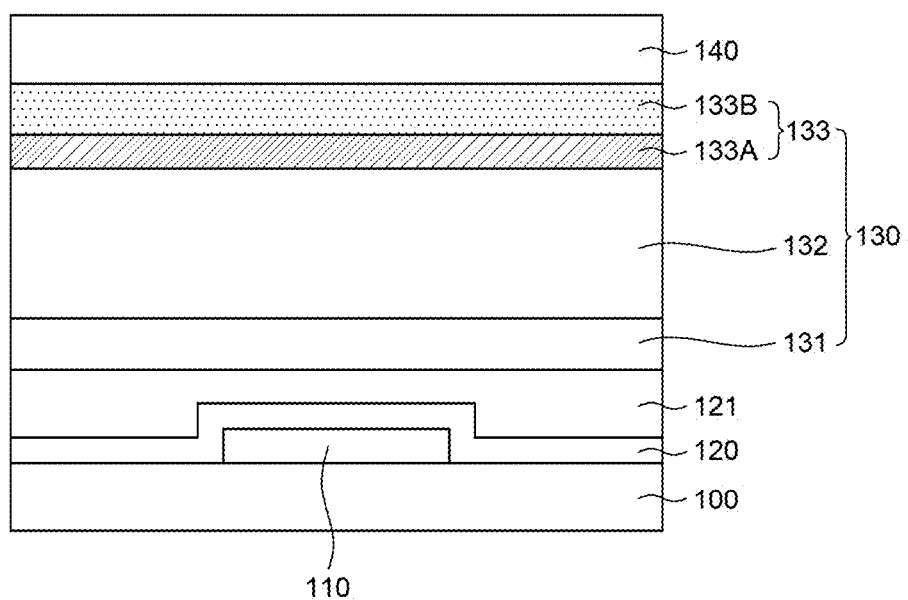
FIG. 1 is a cross-sectional view of an organic light-emitting display device according to one embodiment of the disclosure.

Advantages and features of the present disclosure and methods to achieve them will become apparent from the descriptions of embodiments herein below with reference to the accompanying drawings. However, the present disclosure is not limited to embodiments disclosed herein but may be implemented in various different ways. The embodiments are provided for making the disclosure of the present disclosure thorough and for fully conveying the scope of the present disclosure to those skilled in the art. It is to be noted that the scope of the present invention is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

In describing temporal relationship, terms such as "after," "subsequent to," "next to" and "before" are not limited to "directly after," "directly subsequent to," "immediately next to" "immediately before," and so on, unless otherwise specified.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Features of various embodiments of the present disclosure may be combined partially or totally. As will be clearly appreciated by those skilled in the art, technically various interactions and operations are possible. Various embodiments can be practiced individually or in combination.

Hereinafter, a display panel according to an embodiment of the present disclosure will be described in detail with reference to the accompanying drawings.

FIG. 1 is a cross-sectional view of an organic light-emitting display (OLED) device according to a first embodiment of the present disclosure.

The OLED device 1000 includes a substrate 100, an organic light-emitting element 130 disposed on the substrate 100, and an encapsulation layer 140.

A driving circuit 110 for driving the organic light-emitting element 130 may be disposed on the substrate 100. The driving circuit 110 may include a transistor, a capacitor, etc. The driving circuit 110 may be formed in each of a plurality of sub-pixels formed on the substrate 100. The source electrode or the drain electrode of a transistor may be connected to the anode 131 of the organic light-emitting element 130 to transmit a driving signal to the organic light-emitting element 130.

The substrate 100 serves to support and protect various elements of the OLED device. The substrate 100 may be formed of an insulating material, and may be formed of, for example, glass, polyimide, acryl, polyacrylate, polycarbonate, polyether, sulfonic acid-based material, or a silicon oxide (SiOx) material having flexibility.

The passivation layer 120 may be formed over the driving circuit 110 to protect the driving circuit 110 disposed on the substrate 100 from external contamination or damage. The passivation layer 120 may be formed of silicon nitride (SiNx) or silicon oxide (SiOx) to prevent damage to the active layer of the transistor. The passivation layer 120 may be omitted in some implementations.

Then, a planarization layer 121 is disposed on the passivation layer 120 to cover the level difference on the surface of the substrate 100 created by the driving circuit 110. The planarization layer 121 may be, but is not limited to, an organic layer such as a polyimide or polyacrylic-based layer.

The organic light-emitting element 130 is disposed on the planarization layer 121 and includes an anode 131, an organic light emitting layer 132, and a cathode 133. A hole injecting layer and a hole transporting layer may be interposed between the organic light emitting layer 132 and the anode 131, and an electron transporting layer and an electron injecting layer may be interposed between the organic light emitting layer 132 and the cathode 133. However, these layers are not essential element and thus may be eliminated in some implementations. In addition, the organic light emitting layer 132 may be a single emitting layer that emits red, blue, green, or a similar color, or may be implemented as a tandem structure that includes two or more emitting layers with a charge generation layer (CGL) therebetween.

The anode 131 may be disposed separately in each sub-pixel and is an electrode for supplying or transferring holes to the organic light emitting layer 132. The anode 131 may be connected to the source electrode or the drain electrode of a transistor disposed on the substrate 100.

If the OLED device 1000 is of a top-emission type, a plurality of the anodes 131 may include a reflective layer to facilitate the light emitted from the organic light emitting layer 132 to be reflected by the anodes 131 to exiting upwardly, (i.e., to pass through the cathode 133). For example, the anode 131 may be a two-layer structure formed by stacking a transparent layer and a reflective layer, or a three-layer structure formed by stacking a transparent layer, a reflective layer and a transparent layer. The transparent layer may be formed of a transparent conductive oxide material such as indium tin oxide (ITO) or indium zinc oxide (IZO). The reflective layer may be formed of copper (Cu), silver (Ag), palladium (Pd), aluminum (Al), platinum (Pt), gold (Au), chromium (Cr), tungsten (W), molybdenum (Mo), titanium (Ti), iridium (Ir). Alternatively, the anode 131 may be a single layer formed of a material having the characteristics of a transparent layer and a reflective layer.

The cathode 133 is an electrode that is shared by the plurality of sub-pixels and supplies or transfers electrons to the organic light emitting layer 132. The cathode 133 may be made up of two layers including a first cathode 133A and a second cathode 133B. If the first cathode 133A disposed under the second cathode 133B serves as an electron injection layer, the cathode 133 may be implemented as a single layer composed of the second cathode 133B.

For the top-emission OLED device 1000, the cathode 133 has a transparent characteristic so that light emitted from the organic light emitting layer 132 can pass therethrough. For example, the cathode 133 may be formed of silver (Ag), magnesium (Mg), an alloy thereof, or an alloy of these and other metals. The cathode 133 may be formed of such metals having a very thin thickness. Alternatively, the cathode 133 may be formed of a transparent conductive oxide material such as indium tin oxide or indium zinc oxide, like the transparent layer of the anode 131.

The encapsulation layer 140 is disposed on the organic light-emitting element 130 to protect the organic light-emitting element 130 from moisture or oxygen. The encapsulation layer 140 may be formed of an inorganic layer such as silicon nitride ($SiN_x$), silicon oxide (SiOx), indium tin oxide or indium zinc oxide, or an organic layer such as polyimide, polyacryl, parylene. Alternatively, the encapsulation layer 140 may be formed by using an inorganic layer together with an organic layer.

An organic buffer layer may be disposed between the encapsulation layer 140 and the organic light-emitting element 130. The organic buffer layer may protect the organic light emitting layer 132 from being damaged by plasma generated during deposition of the encapsulation layer 140, and may delay the transfer of moisture permeated into the encapsulation layer 140 to the organic light emitting layer 132.

As described above, since the OLED device 1000 is frequently exposed to UV light, and accordingly the efficiency of the organic light-emitting element 130 is lowered. Therefore, light stability of the organic light-emitting element 130 is required.

As the thickness of the cathode 133 becomes thinner, the transmittance increases, such that the amount of UV light incident on the same area increases. As a result, the reliability of the organic light-emitting element 130 with respect to UV light may be lowered. On the other hand, if the thickness of the cathode 133 is increased to block the incident UV light from the outside, the transmittance of the OLED device 1000 and the efficiency of the organic light-emitting element 130 may be decreased. Therefore, the thickness and the material of the cathode 133 are determined so as to reduce the influence by UV light and to improve the efficiency of the organic light-emitting element 130.

In a top-emission OLED device, the cathode 133 may be formed of silver (Ag) having a high transmittance with respect to the wavelength range of light emitted from the organic light emitting layer 132, and ytterbium (Yb) for improving the reliability against UV light. The effect of ytterbium (Yb) on UV light will be described later. The efficiency of the organic light-emitting element 130 according to the thickness of the cathode 133 will be described first.

The first cathode 133A of the organic light-emitting element 130 may be formed of ytterbium (Yb) or an alloy of ytterbium (Yb) and another metal, and the second cathode 133B thereof may be formed of silver (Ag) or an alloy of silver (Ag) and another metal. When the thickness of the cathode 133 is 120 Å to 250 Å, the thickness of the first cathode 133A may range from 20 Å to 50 Å, and the thickness of the second cathode 133B may range from 100 Å to 200 Å.

The thickness of the cathode 133 has to be determined so that the reliability of the organic light-emitting element against UV light is ensured, which will be described with reference to the graphs shown in FIGS. 2 to 4.

Figure 2A:
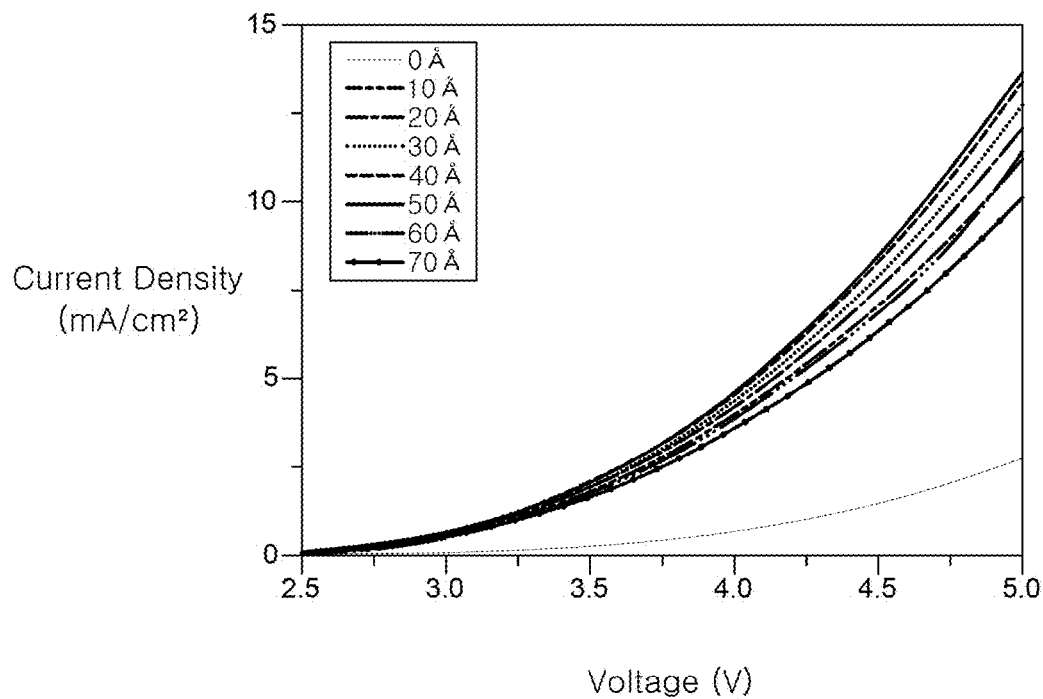
FIGS. 2A to 2C are graphs showing current density versus voltage of the first cathodes having different thicknesses in organic light-emitting element emitting red, green and blue light, respectively.
Figure 2B:
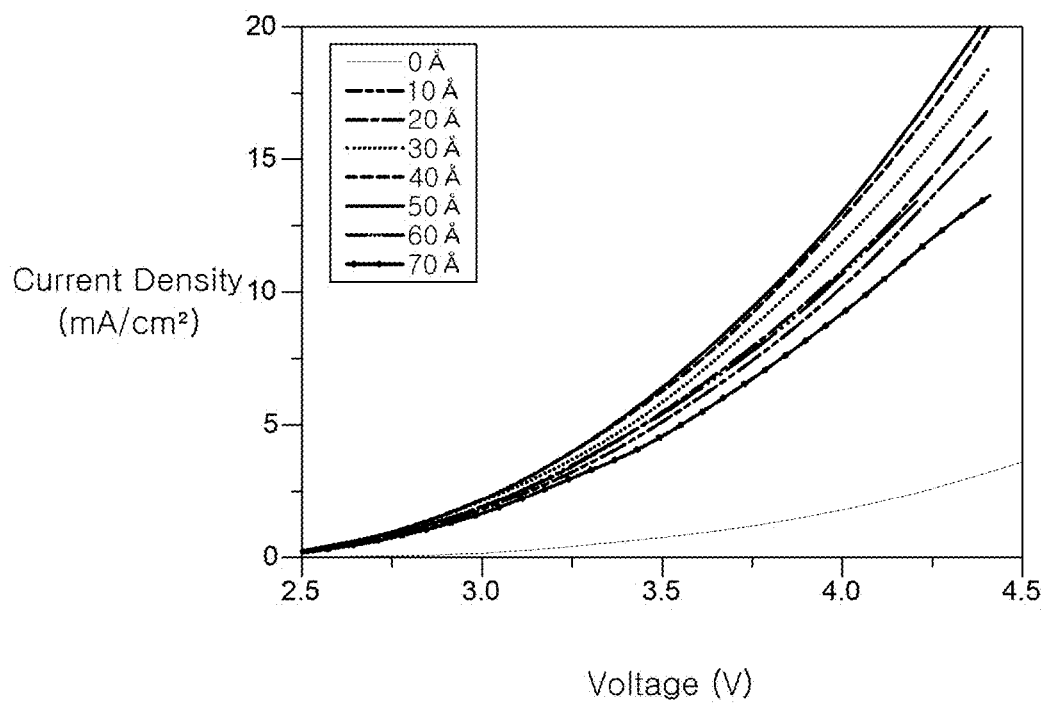
Figure 2C:
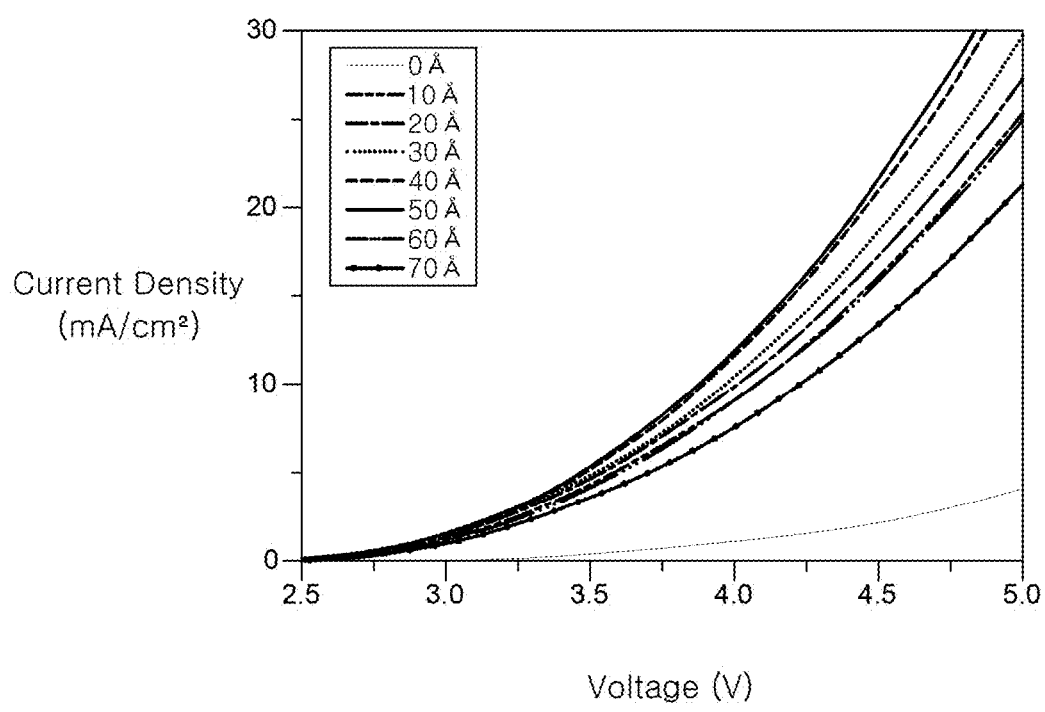

FIGS. 2A to 2C are graphs showing current density versus voltage of the first cathodes having different thicknesses in organic light-emitting elements emitting red, green and blue light, respectively.

In the graphs, the horizontal axis represents voltage in V, and the vertical axis represents current density in mA/cm$^2$. In general, the graphs show that the current density flowing in the organic light-emitting element increases with the voltage, and the curves in the graphs have different slopes depending on the thicknesses of the first cathodes. When the same voltage is applied, a curve having a larger slope has a higher current density, which means a higher efficiency of the organic light-emitting element. When the thickness of the first cathode is 0 Å, the slope of the curve is the lowest. The slope of the curve rises as the thickness of the first cathode increases. When the thickness of the first cathode is 50 Å, the slope of the curve is the largest. When the thickness of the first cathode is 60 Å, the slope of the curve is similar to that when the thickness of the first cathode is 10 Å. Therefore, when the thickness of the first cathode ranges from 20 Å to 50 Å, the current density versus the voltage applied to the organic light-emitting element is high, such that the efficiency of the organic light-emitting element can be improved.

FIGS. 2B and 2C are graphs of organic light-emitting elements that emit green light and blue light, respectively, which show a tendency similar to that of the graph of FIG. 2A. That is, the current density versus the voltage applied to the organic light-emitting element is higher when the thickness of the first cathode ranges from 20 Å to 50 Å than when the thickness of the first cathode is less than 10 Å or greater than 60 Å. Therefore, when the thickness of the first cathode ranges from 20 Å to 50 Å, the efficiency of the organic light-emitting element can be improved.

Figure 3:
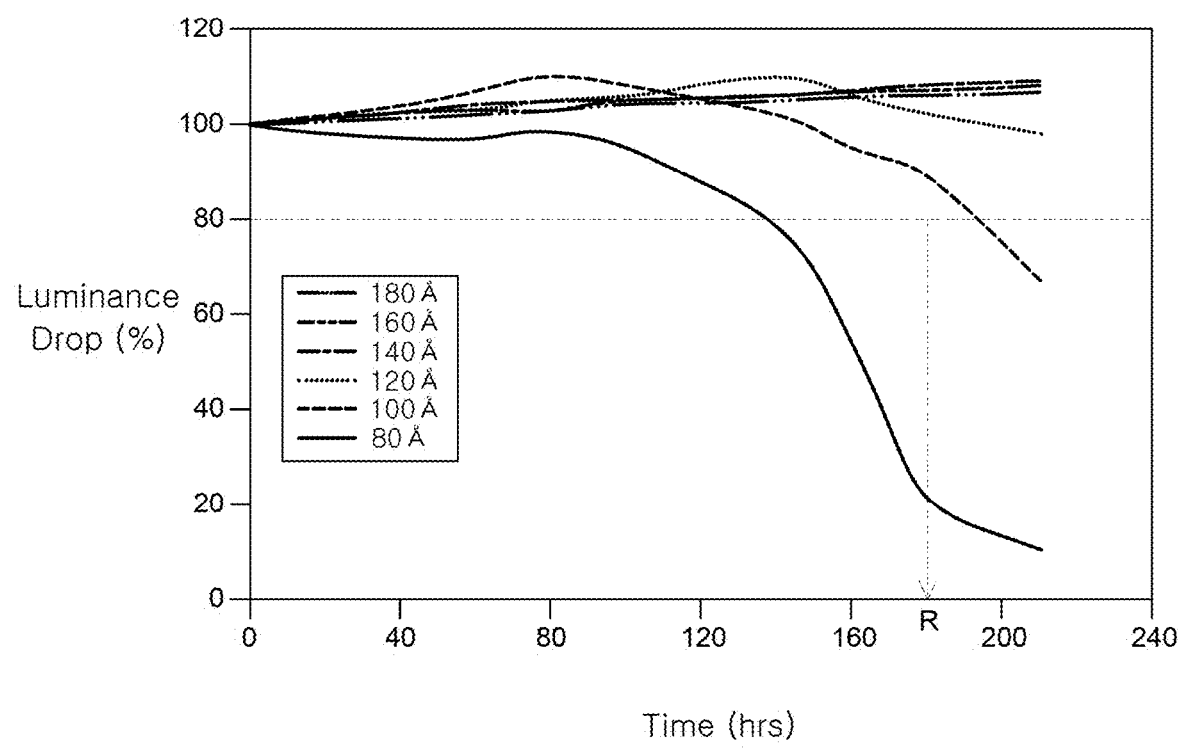
FIG. 3 is a graph showing luminance verses UV light irradiation time of second cathodes having different thicknesses.

FIG. 3 is a graph showing luminance drop in percentage of the OLED device with the first cathode 133A having the thickness of 30 Å while varying the thickness of the second cathode 133B from 80 Å to 180 Å when UV light is irradiated for approximately 210 hours. In the graph shown in FIG. 3, the horizontal axis represents time in hour.

The first cathode 133A may be formed by co-deposition of ytterbium (Yb) and lithium fluoride (LiF), and the second cathode 133B may be formed by co-deposition of silver (Ag) and magnesium (Mg).

The amount of UV light irradiated on the OLED device is 2.4 W/m$^2$, which is based on the amount of light irradiated on the Florida-Miami beach in the United States. In order to ensure the reliability of the OLED device against UV light, the luminance drop should not fall below 80% after it is irradiated with UV light for 180 hours (the reference irradiation time R). That is, when the OLED device is irradiated with UV light for 180 hours, the luminance drop of the OLED device should remain above 80%.

The results of an experiment of measuring the luminance drop of OLED devices for the second cathodes 133B of different thicknesses are as follows:

When the thickness of the second cathode 133B is 80 Å, the luminance of the OLED device is dropped below 80% after UV light has been irradiated for approximately 135 hours.

When the thickness of the second cathode 133B is 100 Å, the luminance of the OLED device is dropped below 80% after UV light has been irradiated for approximately 190 hours.

When the thickness of the second cathode 133B is 120 Å or more, the luminance of the OLED device does not drop below 80% even after the UV light has been irradiated for 200 hours.

Accordingly, the thickness of the second cathode 133B is required to be larger than 100 Å so that the luminance does not drop below 80% after UV light has been irradiated for 180 hours. That is, by making the thickness of the second cathode larger than 100 Å, the light resistance of the OLED device against UV light can be ensured.

Figure 4:
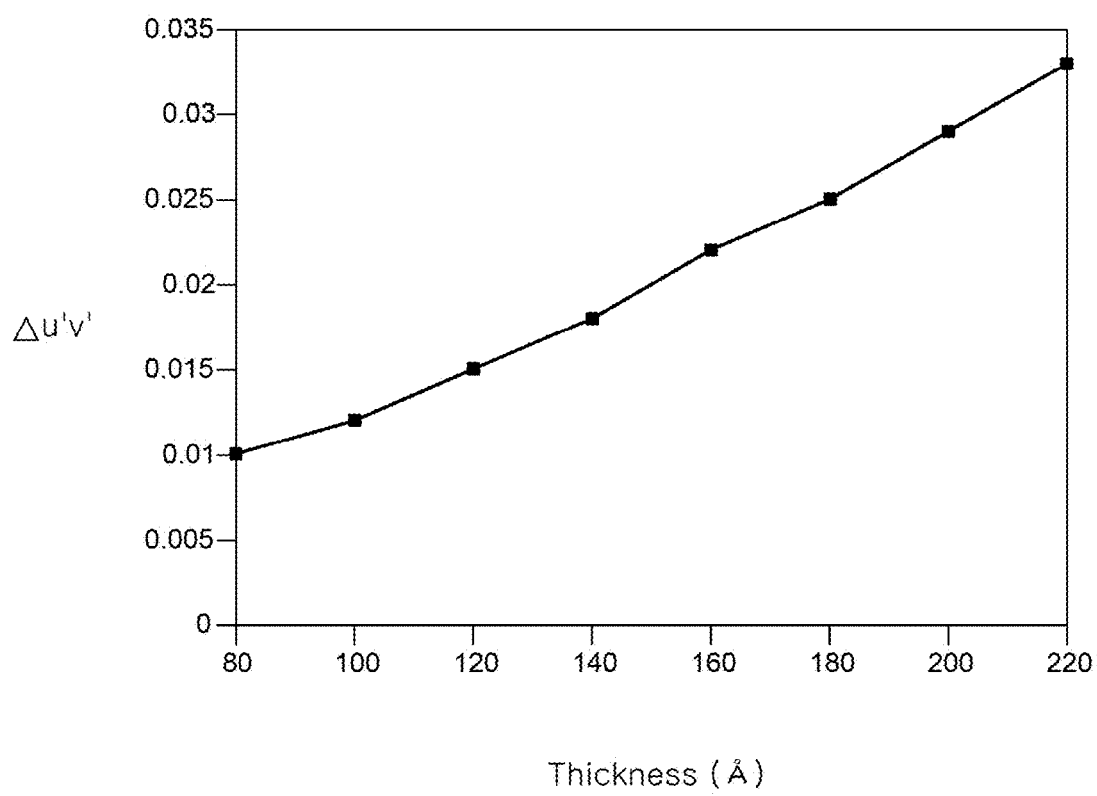
FIG. 4 is a graph showing chromaticity difference $\Delta u'v'$ versus thickness of the second cathode in an organic light-emitting element emitting white light.

FIG. 4 is a graph showing chromaticity difference Δu'v' versus thickness of the second cathode in an organic light-emitting element emitting white light. In FIG. 4, the horizontal axis represents the thickness in Å.

As shown in FIG. 4, as the thickness of the second cathode increases, the light emitted between the anode and the second cathode is reflected off more than it transmits the second cathode. As a result, strong micro-cavity effect occurs, such that the light efficiency at the normal viewing angle increases and accordingly the light efficiency at oblique viewing angles is relatively decreased. That is, as the thickness of the second cathode increases, chromaticity difference or color change rate Δu'v' increases. The chromaticity difference shown in the graph refers to the chromaticity difference over the viewing angles from 0° to 60°. That is, the chromaticity difference is the largest value among the differences between the normal viewing angle and oblique viewing angles from 0° to 60°. A viewer can notice a chromaticity difference Δu'v' above 0.03. Therefore, it is required to remain below 0.03.

Referring to FIG. 4, when the thickness of the second cathode is 180 Å, the chromaticity difference is 0.025. When the thickness of the second cathode is 200 Å, the chromaticity difference is 0.029. Accordingly, by setting the thickness of the second cathode to approximately 200 Å or less, it is possible to reduce the chromaticity difference over viewing angles.

Figure 5:
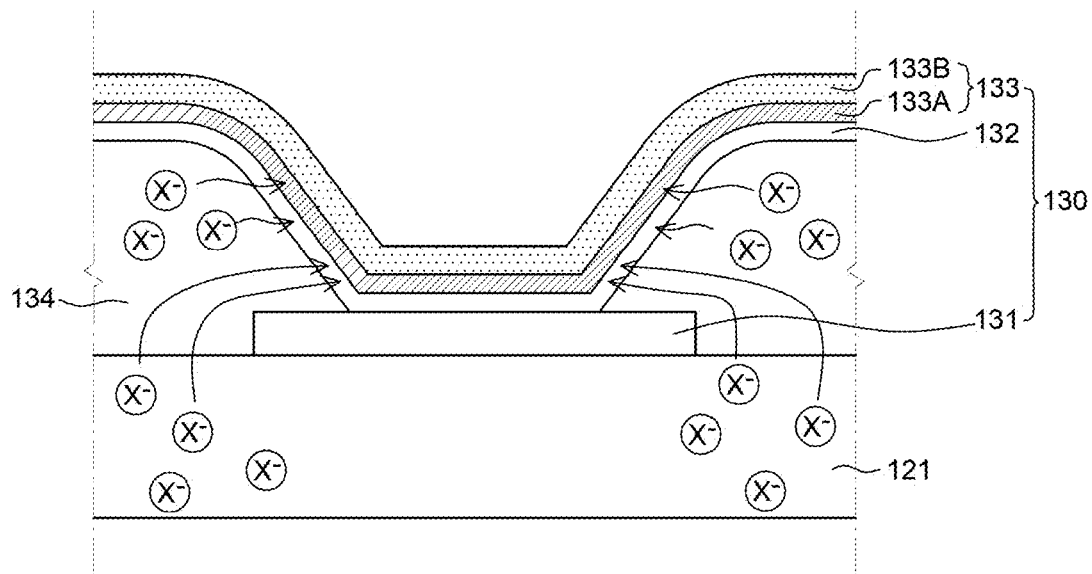
FIG. 5 is a cross-sectional view for illustrating influence on the organic light-emitting element in the OLED device according to the first embodiment of the present disclosure when it is exposed to UV light.

FIG. 5 is a cross-sectional view for illustrating influence on the organic light-emitting element in the OLED device according to the first embodiment of the present disclosure when it is exposed to UV light.

FIG. 1 is the cross-sectional view showing a cross section of an opening of a bank 134 (FIG. 5) of a sub-pixel formed in an active area of the OLED device 1000, whereas FIG. 5 is a cross-sectional view showing a stack structure of layers from the planarization layer 121 to the cathode 133, plus the bank 134. Therefore, the elements identical to those of FIG. 1 will not or briefly describe.

The bank 134 is disposed in a non-emission area other than the emission area of a sub-pixel. That is, the emission area corresponds to the opening of the bank 134 and may overlap with the edge of the anode 131. The organic light emitting layer 132 is disposed on the bank 134 and in the opening of the bank 134 or in the opening of the bank 134. The cathode 133 is disposed on the organic light emitting layer 132.

The planarization layer 121 and the bank 134 may be polyimide or polyacryl-based organic layers, and the organic layers may be exposed to UV light to generate anion $X^-$. The anion $X^-$ may be, but is not limited to, hexene-nitrile or NMP (N-methylpyrrolidone). The arrows indicate the direction in which the anions $X^-$ move. That is, the anions $X^-$ generated in the planarization layer 121 and the bank 134 may pass through the organic light emitting layer 132 and affect the first cathode 133A. The first cathode 133A may be an electron injection layer. When the first cathode 133A is formed by co-deposition of magnesium (Mg) and lithium fluoride (LiF), the anions may combine lithium ions $Li^+$ that are components of the first cathode 133A to deteriorate the electron injection ability of the organic light-emitting element 130. For this reason, instead of magnesium (Mg), by forming the first cathode 133A with a metal having a higher reactivity than that of lithium (Li), it is possible to facilitate bonding with anions generated in the organic layers while maintaining the generation of lithium ions $Li^+$ that enhances the electron injection ability. Such a metal having a higher reactivity than that of lithium (Li) may be an alkali metal, an alkaline earth metal, or a metal belonging to the lanthanum group among rare earth metals. To have a higher reactivity than that of the lithium (Li), the metal may have a work function smaller than that of lithium (Li). Example metals as shown in Table 1, for example.

TABLE 1

| Material | | Work Function (eV) |
| --- | --- | --- |
| Alkali metal | Li | 2.93 |
| | Na | 2.36 |
| | K | 2.29 |
| | Rb | 2.26 |
| | Cs | 2.14 |
| Alkaline earth metal | Sr | 2.59 |
| | Ba | 2.52 |
| Lanthanum group | Ce | 2.90 |
| | Sm | 2.70 |

TABLE 1-continued

| Material | Work Function (eV) |
| --- | --- |
| Eu | 2.50 |
| Gd | 2.90 |
| Yb | 2.60 |

Therefore, the first cathode 133A can improve the reliability of the organic light-emitting element with respect to UV light by co-depositing a metal having a work function of 2.93 eV or less and a material having electron injection ability together with lithium fluoride (LiF). By doing so, the efficiency and lifetime of the organic light-emitting element can be improved.

Figure 6:
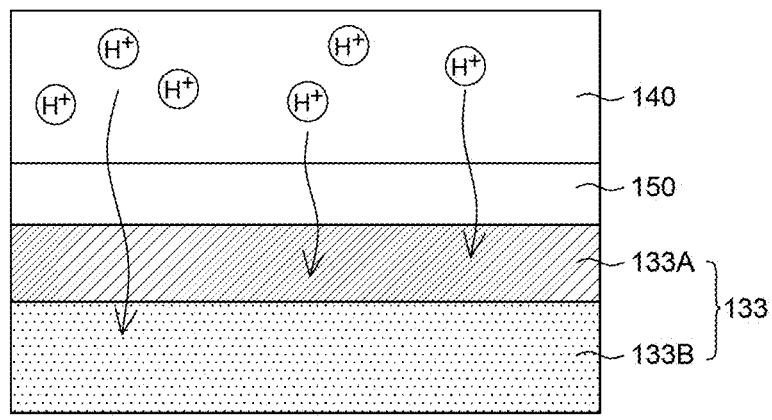
FIG. 6 is a cross-sectional view for illustrating influence on an organic light-emitting element in an OLED device according to a second embodiment of the present disclosure when it is exposed to UV light.

FIG. 6 is a cross-sectional view for illustrating influence on an organic light-emitting element in an OLED device according to a second embodiment of the present disclosure when it is exposed to UV light.

FIG. 6 illustrates a stack structure of layers from the cathode 133 to the encapsulation layer 140 among the layers of the OLED device 1000 of FIG. 1. Therefore, the redundant description will be omitted.

Referring to FIG. 6, a first cathode 133A of the cathode 133 may be disposed on a second cathode 133B. The encapsulating layer 140 may be disposed on the cathode 133, such that it is possible to reduce permeation of moisture, oxygen, etc. from the outside into the organic light-emitting element.

In addition, a capping layer 150 may be disposed between the cathode 133 and the encapsulation layer 140. The capping layer 150 may cover the cathode 133 of the organic light-emitting element to reduce oxygen and moisture introducing from the outside, and may attach the organic light emitting layer 132 formed of an organic material to the encapsulation layer 140 formed of an inorganic material so that they are not separated from each other in a high temperature/high humidity environment. The capping layer 150 may be an insulating layer formed of an organic material or an inorganic material.

The encapsulation layer 140 may be formed of a single layer or two or more layers of an inorganic layer including an inorganic material as an encapsulating material such as glass, plastic, metal, or a face seal. The encapsulation layer 140 may be formed by stacking a plurality of inorganic films and organic films including organic material. The encapsulation layer 140 may be formed of a material such as silicon oxide ($SiO_x$), silicon nitride ($SiN_x$), or silicon oxynitride ($SiON_x$) to maintain the flexibility of the OLED device.

The inorganic film may be formed by chemical vapor deposition (CVD), and hydrogen ions ($H^+$) are generated when the inorganic film is formed. A large amount of hydrogen ions ($H^+$) are generated by UV light irradiation even after the organic light-emitting element has been fabricated. In addition, the hydrogen ions ($H^+$) generated in the inorganic layer, for example, the encapsulation layer 140 have good diffusion characteristics, and thus may diffuse through the capping layer 150 to reach the cathode 133 and affect the cathode 133.

The second cathode 133B may be formed by co-deposition of silver (Ag) and magnesium (Mg). And, silver (Ag) particles tend to aggregate. Accordingly, magnesium (Mg) atoms are positioned between silver (Ag) atoms by the co-deposition with magnesium (Mg), such that it is possible to reduce silver (Ag) particles from aggregating. When UV light is irradiated or heat is applied, silver (Ag) particles are more likely to aggregate, such that the cathode 133 may shrink.

The hydrogen ions ($H^+$) generated in the encapsulation layer 140 are diffused and react with the magnesium (Mg) of the second cathode 133B to form magnesium hydride ($MgH_2$). Silver (Ag) particles tend to aggregate due to UV light irradiation, and the magnesium (Mg) that inhibits aggregation of silver (Ag) moves to bond with hydrogen ($H_2$), such that silver (Ag) gets together in the center portion of the second cathode 133B in the thickness direction. The magnesium (Mg) is concentrated to the upper and lower portions of the second cathode 133B, and the overall thickness of the second cathode 133B becomes thinner.

And, the edge of the bank may be tapered, and the organic light emitting layer 132 and the cathode 133 are formed at the edge and in the opening of the bank. The thickness of the cathode 133 formed on the boundary of the stepped portion created by the bank, for example, the boundary of the sub-pixel and the tapered edge of the bank is thinner than the thickness of the cathode 133 formed in the opening of the bank. For example, the boundary of the sub-pixel is vulnerable to the aggregation of silver (Ag) particles than the opening of the bank, because silver (Ag) particles may aggregate at the center of the sub-pixel. Accordingly, the emission area of the sub pixel may shrink when the OLED device is driven.

In order to reduce aggregation of the silver (Ag) particles included in the second cathode 133B, magnesium (Mg) should not react with hydrogen ($H_2$) but prevent aggregation of the silver (Ag) particles between them. In detail, the first cathode 133A, which is an auxiliary layer of the second cathode 133B, is disposed on the second cathode 133B, and the first cathode 133A includes a metal having a higher reactivity with hydrogen ($H_2$) than that of magnesium (Mg) so that the metal reacts with hydrogen ($H_2$), thereby reducing aggregation of silver (Ag) particles.

The work function of magnesium (Mg) is 3.66 eV, and the metal having the higher reactivity than that of magnesium (Mg) should have a work function smaller than that of magnesium (Mg). Example metals having a work function smaller than that of magnesium (Mg) may include, but are not limited to, the metals listed in Table 2 in addition to the metals included in Table 1.

TABLE 2

| Material | | Work function (eV) |
|---|---|---|
| Transition metal | Sc | 3.5 |
| | Y | 3.1 |
| Lanthanum group | Lu | 3.3 |
| | Nd | 3.2 |

Accordingly, by disposing the first cathode 133A including the metal having a higher reactivity than that of magnesium (Mg) between the second cathode 133B and the capping layer 150, it is possible to reduce aggregation of the silver (Ag) particles included in the second cathode 133B due to UV light irradiation and to prevent the emission area of the sub-pixel from shrinking.

Figure 7:
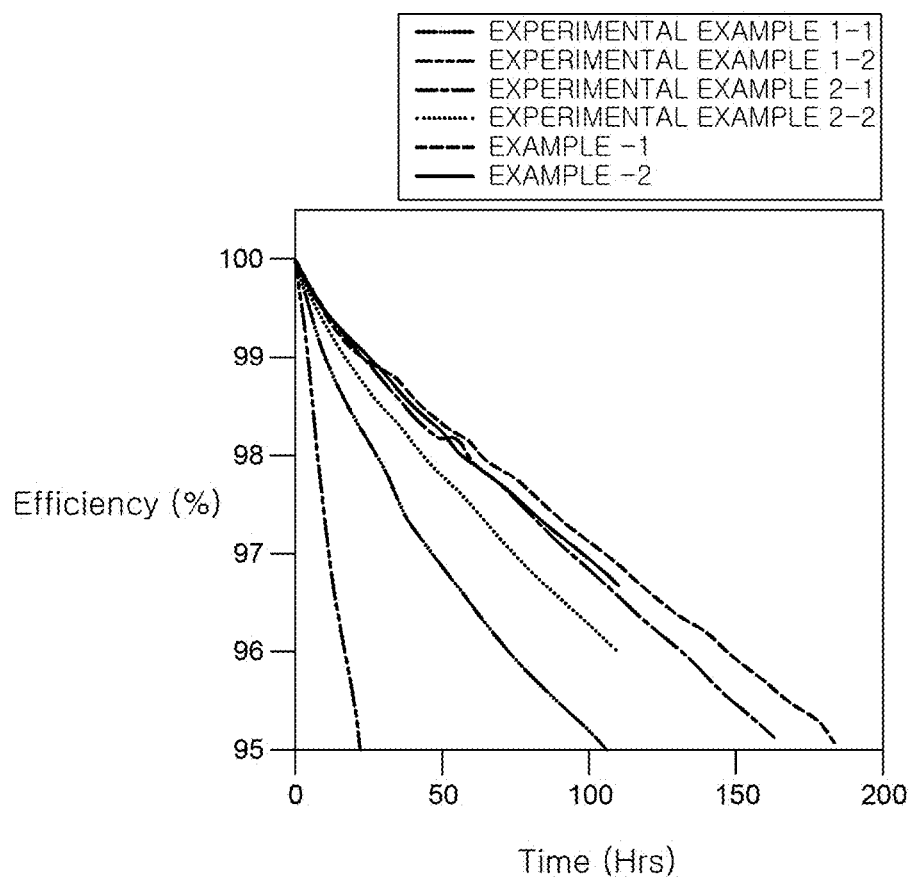
FIG. 7 is a graph showing the efficiency of blue organic light-emitting elements before and after UV light irradiation for different materials of the first cathode.

FIG. 7 is a graph showing the efficiency of blue organic light-emitting elements with different materials of the first cathode before and after UV light irradiation. That is, the graph shows the efficiency versus driving time of the blue organic light-emitting element before UV light irradiation and after the UV light irradiation for 80 hours. In FIG. 7, the horizontal axis represents time in hour, and the vertical axis represents efficiency in percentage.

In Experimental Examples 1-1 and 1-2, the first cathode was formed by co-deposition of magnesium (Mg) and lithium fluoride (LiF). In Experimental Examples 2-1 and 2-2, the first cathode was formed of ytterbium (Yb). In Examples 1 and 2, the first cathode was formed by co-deposition of ytterbium (Yb) and lithium fluoride (LiF).

Experimental Example 1-1, Experimental Example 2-1 and Example 1 were measured before UV light irradiation. Experimental Example 1-2, Experimental Example 2-2 and Example 2 were measured after UV light irradiation for 80 hours.

Comparing the curves of Experimental Example 1-1, Experimental Example 2-1 and Example 1 before UV light irradiation, the time taken until the efficiency of the organic light-emitting element decreases is longest in Experimental Example 1-1, followed by Experimental Example 2-1, and followed by Example 1. In other words, the efficiency of the blue organic light-emitting element is improved most in Experimental Example 1-1, followed by Experimental Example 2-1, and followed by Example 1.

Then, comparing the curves before and after UV light irradiation for each sample, after 80 hours of UV light irradiation, the efficiency of the blue organic light-emitting elements are drastically reduced compared to that before the UV light irradiation. The difference in efficiency before and after UV light irradiation was the largest in Experimental Examples 1, followed by Experimental Examples 2, and Examples showed the smallest difference in efficiency before and after UV light irradiation. That is, when the first cathode is formed using ytterbium (Yb) and lithium fluoride (LiF), it is possible to reduce the efficiency drop of the blue organic light-emitting element due to UV light irradiation.

As described above, when an OLED device is exposed to UV light for a long period of time, out-gassing takes place in the bank or the planarization layer. Out-gassing components, i.e., anions are react with lithium (Li) included in the first cathode or the electron injection layer, to deteriorate the electron injection ability. As a result, there is a problem that the efficiency of the organic light-emitting element is reduced. In addition, when the OLED device is exposed to UV light for a long time, hydrogen ions are generated in the encapsulation layer including an inorganic layer. The hydrogen ions react with the second cathode, such that silver (Ag) particles aggregate and the emission area of a sub-pixel shrinks.

Therefore, by applying ytterbium (Yb), which is highly reactive with halogen elements and nonmetals, to the first cathode, it is possible to inhibit the out-gassing components from reacting with lithium (Li), and by using lithium fluoride (LiF) to facilitate generation of lithium ions ($Li^+$), it is possible to enhance the electron injection ability and to reduce aggregation of silver (Ag) particles to prevent shrinkage of the emission area of the sub-pixel.

That is, by forming the first cathode using ytterbium (Yb) and lithium fluoride (LiF), it is possible to reduce the efficiency drop of the organic light-emitting element due to the UV light and to improve the lifespan of the organic light-emitting element.

It is to be noted that the material used for the first cathode of the first embodiment is not limited to ytterbium (Yb) and lithium fluoride (LiF). It may also be formed by co-depositing lithium fluoride (LiF) and a material having high reactivity with halogen elements and nonmetal.

Figure 8:
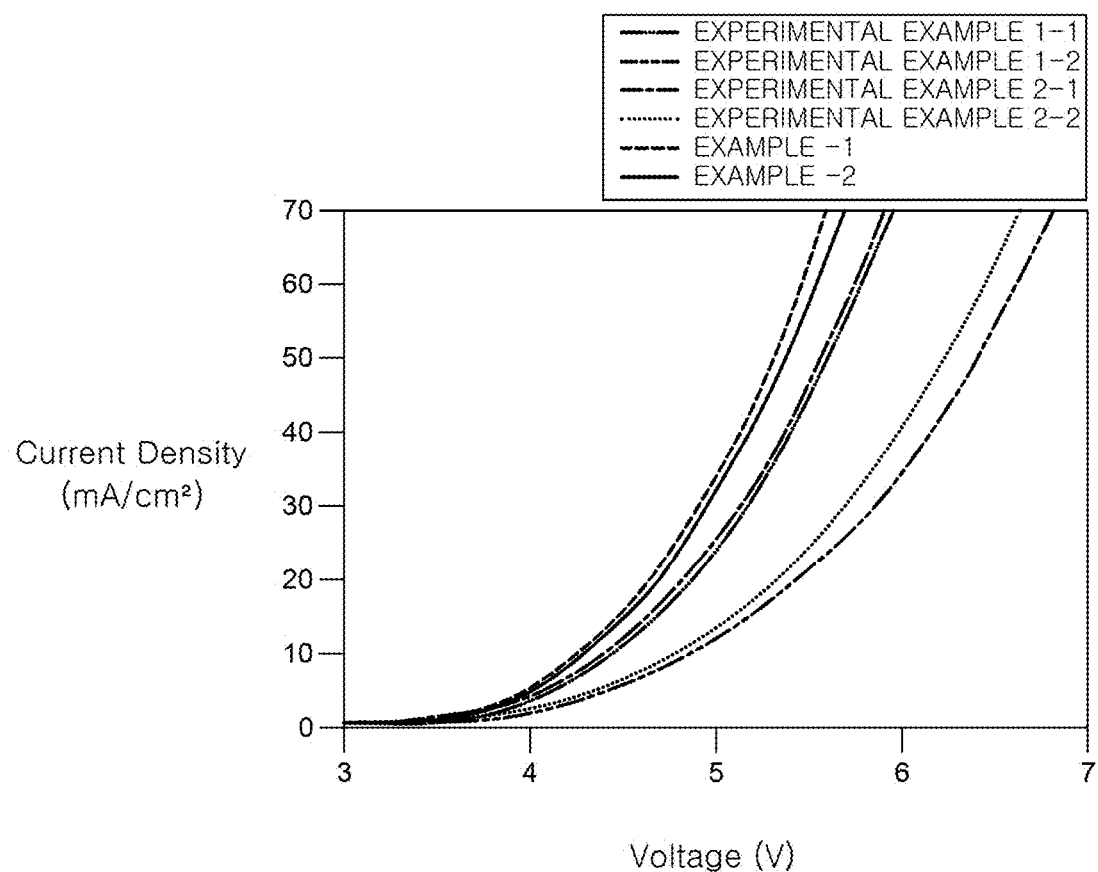
FIG. 8 is a graph showing current density versus voltage of blue organic light-emitting elements before and after UV light irradiation for different materials of the first cathode.

FIG. 8 is a graph showing current density versus voltage of blue organic light-emitting elements with different materials of the first cathode before and after UV light irradiation. That is, the graph shows the current density versus voltage in the blue organic light-emitting elements before UV light irradiation and after the UV light irradiation for 80 hours. In FIG. 8, the horizontal axis represents voltage in V, and the vertical axis represents current density in mA/cm$^2$.

Similarly to the materials used for the examples of FIG. 7, in Experimental Examples 1-1 and 1-2, the first cathode was formed by co-deposition of magnesium (Mg) and lithium fluoride (LiF), in Experimental Example 2-1 and Experimental Example 2-2, the first cathode was formed of ytterbium (Yb), and in Examples 1 and 2, the first cathode was formed by co-deposition of ytterbium (Yb) and lithium fluoride (LiF).

Comparing the curves of Experimental Example 1-1, Experimental Example 2-1 and Example 1 before UV light irradiation, the voltage-current density graphs in Experimental Example 1-1 and Experimental Example 2-1 are similar, but the current density for the same voltage is improved in Example 1 as compared with Experimental Example 1-1 and Experimental Example 2-1.

Comparing the curves before and after UV light irradiation for each sample, after 80 hours of UV light irradiation, the current density for the same voltage was drastically reduced after UV light irradiation compared with that before UV light irradiation. The difference in current density is large before and after UV light irradiation, i.e., between Experimental Example 1-1 and Experimental Example 1-2, and between Experimental Example 2-1 and Experimental Example 2-2. In contrast, between Example 1 and Example 2, there is almost no difference in the current density before and after UV light irradiation.

As described above with reference to FIG. 7, when an OLED device is exposed to UV light for a long period of time, out-gassing takes place in the bank or the planarization layer. The out-gassing components, i.e., anions are react with lithium (Li) included in the first cathode or the electron injection layer, to deteriorate the electron injection ability. As a result, there is a problem that the efficiency of the organic light-emitting element is reduced, the driving voltage increases and the luminance drops. In addition, when the OLED device is exposed to UV light for a long time, hydrogen ions are generated in the encapsulation layer including an inorganic layer. The hydrogen ions react with the second cathode, such that silver (Ag) particles aggregate and the emission area of a sub-pixel shrinks.

Therefore, by using ytterbium (Yb), which is highly reactive with halogen elements and nonmetals, it is possible to inhibit the out-gassing components from reacting with lithium (Li), and by using lithium fluoride (LiF) to facilitate generation of lithium ions (Li$^+$), it is possible to enhance the electron injection ability to reduce driving voltage, and to reduce aggregation of silver (Ag) particles to prevent shrinkage of the emission area of the sub-pixel.

That is, by forming the first cathode using ytterbium (Yb) and lithium fluoride (LiF), it is possible to reduce the driving voltage of the organic light-emitting element with respect to the UV light and to improve the lifespan of the organic light-emitting element.

It is to be noted that the material used for the first cathode of the first embodiment is not limited to ytterbium (Yb) and lithium fluoride (LiF). It may also be formed by co-depositing lithium fluoride (LiF) and a material having high reactivity with halogen elements and nonmetal.

Figure 9:
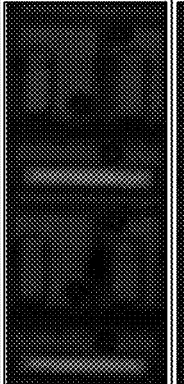
FIG. 9 is an image showing shrinkage of the emission areas of sub-pixels before and after UV light irradiation for different materials of the first cathode.

FIG. 9 is an image showing shrinkage of the emission area of sub-pixels before and after UV light irradiation for different materials of the first cathode. Similarly to the materials used for the examples of FIGS. 7 and 8, in Experimental Example 1, the first cathode was formed by co-deposition of magnesium (Mg) and lithium fluoride (LiF), in Experimental Example 2, the first cathode was formed of ytterbium (Yb), and in Example, the first cathode was formed by co-deposition of ytterbium (Yb) and lithium fluoride (LiF).

Comparing the sizes of the emission areas after turning on red sub-pixels only, it can be seen that the boundary of the emission areas of Experimental Example 1 become blurred compared to Experimental Examples 2 and Example. Actually, the size of the region where the red light is emitted became smaller. Similarly to the red sub-pixels, for green and blue sub-pixels, it can be seen that the emission areas of Experimental Example 1 became significantly shrank compared to Experimental Example 2 and Example.

Therefore, by forming the first cathode with ytterbium (Yb), it is possible to reduce aggregation of silver (Ag) particles due to UV light, and to prevent shrinkage of the emission area of the sub pixel.

Figure 10A:
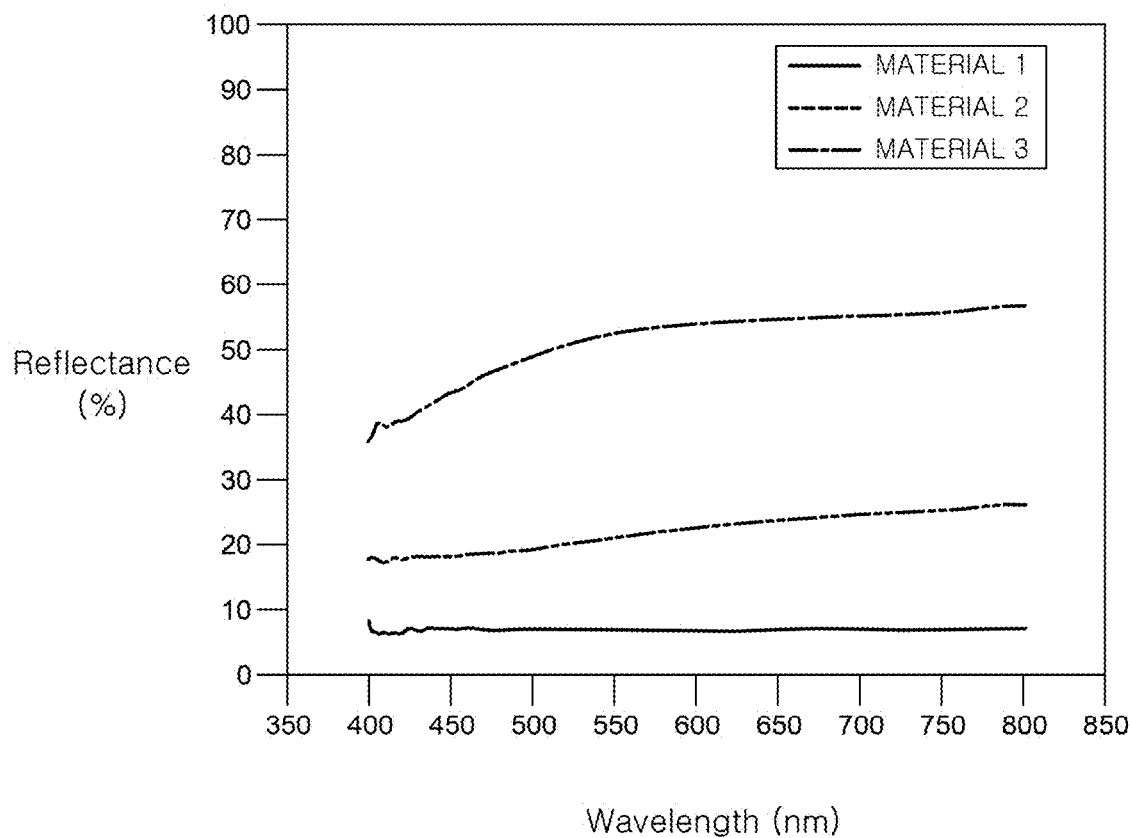
FIG. 10A is a graph showing reflectance versus wavelength for different materials of the cathode.
Figure 10B:
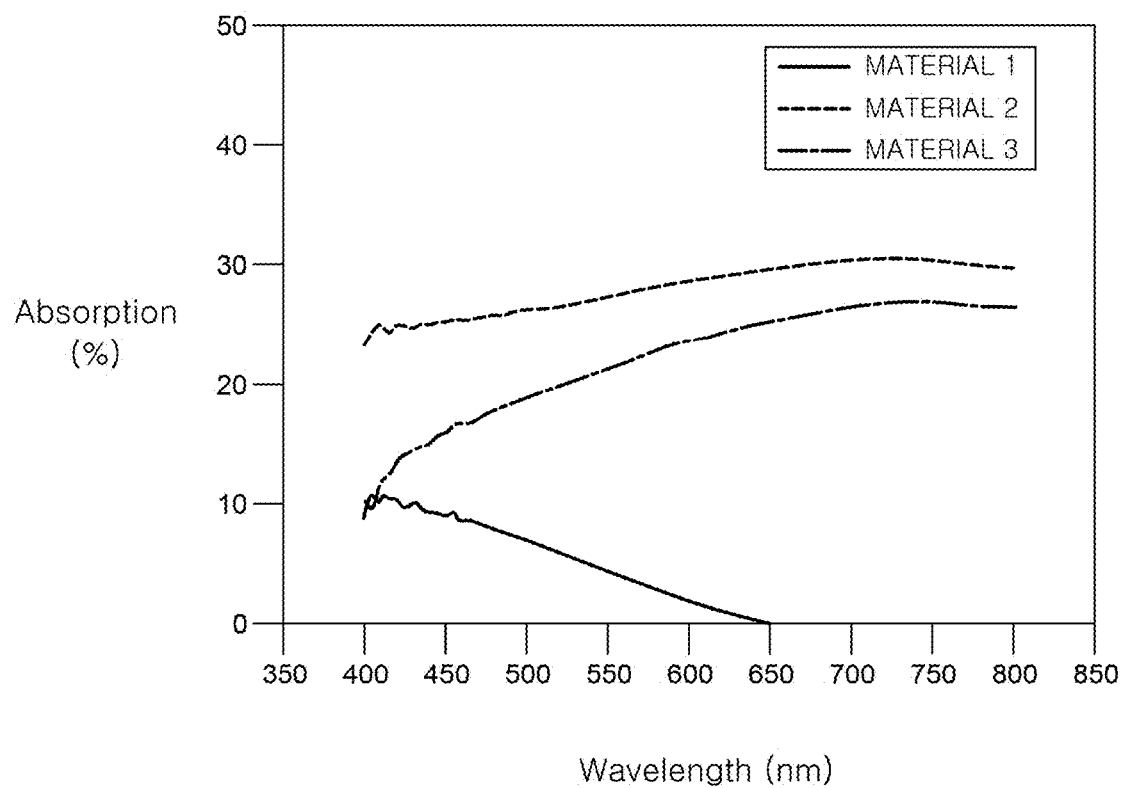
FIG. 10B is a graph showing absorption versus wavelength for different materials of the cathode.

FIG. 10A is a graph showing reflectance versus wavelength for different materials of the cathode. FIG. 10B is a graph showing absorption versus wavelength for different materials of the cathode. In FIG. 10A, the horizontal axis represents wavelength in nm, and the vertical axis represents reflectance in percentage (%). In FIG. 10B, the horizontal axis represents wavelength in nm, and the vertical axis represents absorption in percentage (%).

The graphs shows the reflectance and the absorption when the materials 1, 2 and 3 possibly used for the cathode have the thickness of 160 Å. The materials 1, 2 and 3 may be, but is not limited to, magnesium (Mg), ytterbium (Yb), and silver (Ag), respectively. Ytterbium (Yb) may be replaced with a material having a high reactivity with halogen elements and nonmetals. Magnesium (Mg) may be replaced with an alkali metal or alkaline earth metal material having a higher reactivity than that of magnesium (Mg).

In the example shown in FIGS. 10A and 10B, the first cathode includes ytterbium (Yb), and the second cathode includes silver (Ag) and magnesium (Mg).

As described above, as the content of silver (Ag) increases, aggregation of silver (Ag) is further accelerated by UV light irradiation, so that shrinkage of the sub-pixel occurs quickly. Accordingly, by using ytterbium (Yb) in the first cathode, it is possible to suppress aggregation of silver (Ag) particles and prevent shrinkage of the sub-pixel. However, ytterbium (Yb) has a very high absorption compared to magnesium (Mg) in the entire wavelength range, and thus the efficiency of the organic light-emitting element decreases as the content of ytterbium (Yb) increases. The entire wavelength range may range approximately from 400 nm to 800 nm.

In order to increase the efficiency of the organic light-emitting element, the reflectivity of the cathode is required to be high, and the surface resistance is required to be small. In the second cathode, silver (Ag) has higher reflectivity of light and lower surface resistance than magnesium (Mg).

Therefore, the efficiency of the organic light-emitting element can be improved by mixing silver (Ag) at a higher ratio than magnesium (Mg) to form the second cathode.

The embodiments of the present disclosure can also be described as follows:

According to an embodiment of the present disclosure, an organic light-emitting display device comprises an organic light-emitting element on a substrate, the organic light-emitting element including an anode, an organic light emitting layer, and a cathode, an organic layer between the substrate and the organic light-emitting element, and an auxiliary layer adjacent to the cathode. The auxiliary layer includes a material having electron injection characteristic, such that the influence on the OLED device by UV light is reduced, thereby improving the efficiency and lifespan of the organic light-emitting element.

According to one or more embodiments, the auxiliary layer may include a material that combines with anions generated in the organic layer in accordance with UV light irradiation.

According to one or more embodiments, the auxiliary layer may include a metal having a work function of 2.93 eV or less, and may be formed by co-deposition of the metal and the material having the electron injection characteristic.

According to one or more embodiments, the auxiliary layer may include at least one among Ba, Ce, Cs, Eu, Gd, K, Li, Na, Rb, Sm, Sr and Yb.

According to one or more embodiments, the material having the electron injection characteristic may include LiF.

According to one or more embodiments, the substrate may be a flexible substrate.

According to one or more embodiments, the auxiliary layer may be between the cathode and the organic light emitting layer.

According to an another embodiment of the present disclosure, an organic light-emitting display device comprises an organic light-emitting element including a cathode having silver (Ag), an anode and an organic light emitting layer, an inorganic layer on the organic light-emitting element, and an auxiliary layer adjacent to the cathode. The auxiliary layer having a material that reduces aggregation of the silver (Ag), such that it is possible to prevent the shrinkage of the emission area of a sub-pixel due to the aggregation of the silver (Ag).

According to one or more embodiments, the auxiliary layer may include a material that easily combines with hydrogen ions generated in the inorganic layer.

According to one or more embodiments, the auxiliary layer may include a metal having a work function of 3.66 eV or less.

According to one or more embodiments, the auxiliary layer may include at least one among Ba, Ce, Cs, Eu, Gd, K, Li, Lu, Na, Rb, Sc, Sm, Sr, Yb and Y.

According to yet another embodiment of the present disclosure, an organic light-emitting display device comprises an organic layer on a flexible substrate, an anode on the organic layer, an light emitting layer on the anode, and a cathode on the light emitting layer, the cathode having silver (Ag) and including a thickness of 120 Å to 250 Å, such that the efficiency and lifespan of the organic light-emitting display device can be improved.

According to one or more embodiments, the cathode may include a first layer and a second layer. A thickness of the first layer may be 20 Å to 50 Å, and a thickness of the second layer may be 100 Å to 200 Å.

According to one or more embodiments, the cathode may include a first layer and a second layer, and the first layer may be an electron injection layer.

According to one or more embodiments, the cathode may include a first layer and a second layer, and the first layer may include ytterbium (Yb), and the second layer may include silver (Ag).

According to one or more embodiments, the second cathode may further include at least one of an alkali metal or an alkaline earth metal, and the second layer may include a higher proportion of the silver (Ag) than the at least one of the alkali metal or the alkaline earth metal.

According to one or more embodiments, the first layer may be disposed closer to the light emitting layer than the second layer is to the light emitting layer.

According to one or more embodiments, the light emitting layer may emit a single color.

According to one or more embodiments, the light emitting layer may be a stack of layers having layers emitting red, green and blue colors, respectively, such that the light emitting layer emits white color.

Thus far, embodiments of the present disclosure have been described in detail with reference to the accompanying drawings. However, the present disclosure is not limited to the embodiments, and modifications and variations can be made thereto without departing from the technical idea of the present disclosure. Accordingly, the embodiments described herein are merely illustrative and are not intended to limit the scope of the present disclosure. The technical idea of the present disclosure is not limited by the embodiments. Therefore, it should be understood that the above-described embodiments are not limiting but illustrative in all aspects. The scope of protection sought by the present disclosure is defined solely by the appended claims and all equivalents thereof are construed to be within the true scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting display device, comprising:
an anode layer having a plurality of anodes on an organic layer;
a bank on the plurality of anodes;
a plurality of openings in the bank positioned to be aligned with each of the respective anodes;
an organic light emitting layer overlying the bank and the opening;
a cathode overlying the organic light emitting layer and the bank;
an electron injecting layer between the organic light emitting layer and the cathode;
the organic layer being positioned between the substrate and the anode layer; and
an auxiliary layer adjacent to the cathode, the auxiliary layer including a metal material having a higher reactivity with anions than a material of lithium (Li),
wherein the auxiliary layer is overlying the bank and extends as a single, contiguous layer to each of the opening to be on each respective anode.

2. The device of claim 1, wherein the anions generated in the organic layer are under the organic light emitting layer in accordance with UV light irradiation.

3. The device of claim 2, wherein the metal material has a work function of 2.93 eV or less, and the auxiliary layer is formed by co-deposition of the metal material and a material having an electron injection characteristic.

4. The device of claim 3, wherein the auxiliary layer includes at least one among Ba, Ce, Cs, Eu, Gd, K, Li, Na, Rb, Sm, Sr and Yb.

5. The device of claim 3, wherein the material has an electron injection characteristic and includes LiF.

6. The device of claim 1, wherein the substrate is a flexible substrate.

7. The device of claim 1, wherein the auxiliary layer is between the cathode and the organic light emitting layer.

8. An organic light-emitting display device, comprising:
an organic layer on a flexible substrate;
a plurality of anodes on the organic layer;
a light emitting layer on the plurality of anodes;
a cathode on the light emitting layer, the cathode including a thickness of 120 Å to 250 Å, the cathode including a first layer under a second layer, the second layer having silver (Ag), the first layer including a metal material having a higher reactivity with anions than a material of lithium (Li);
an electron injecting layer between the light emitting layer and the cathode;
a bank on the plurality of anodes; and
a plurality of openings in the bank positioned to be aligned with each of the respective anodes;
wherein the light emitting layer is on the bank and positioned within each of the openings to be on each respective anode,
wherein the first layer is on the bank and extends as a single, contiguous layer to each of the openings to be on each respective anode.

9. The device of claim 8, wherein a thickness of the first layer is 20 Å to 50 Å, and a thickness of the second layer is 100 Å to 200 Å.

10. The device of claim 8, wherein the first layer includes ytterbium (Yb).

11. The device of claim 8, wherein the second layer further includes at least one of an alkali metal or an alkaline earth metal, and wherein the second layer includes a higher proportion of the silver (Ag) than the at least one of the alkali metal or the alkaline earth metal.

12. The device of claim 10, wherein the first layer is disposed closer to the light emitting layer than the second layer is to the light emitting layer.

13. The device of claim 8, wherein the light emitting layer emits a single color.

14. The device of claim 8, wherein the light emitting layer is a stack of layers having layers emitting red, green and blue colors, respectively, such that the light emitting layer emits white color.

15. The device of claim 1, wherein the cathode is formed by co-deposition of silver and magnesium.

16. The device of claim 9, wherein a chromaticity difference of the device is below 0.03.

* * * * *